(12) United States Patent
Hua

(10) Patent No.: US 7,560,373 B1
(45) Date of Patent: Jul. 14, 2009

(54) LOW TEMPERATURE SOLDER METALLURGY AND PROCESS FOR PACKAGING APPLICATIONS AND STRUCTURES FORMED THEREBY

(76) Inventor: Fay Hua, 626 Bella Vista Ct., Fremont, CA (US) 94539

( * ) Notice: Subject to any disclaimer, the term of this patent is extended or adjusted under 35 U.S.C. 154(b) by 0 days.

(21) Appl. No.: 12/059,281

(22) Filed: Mar. 31, 2008

(51) Int. Cl.
*H01L 21/44* (2006.01)
(52) U.S. Cl. .............. 438/612; 438/613; 257/E21.508
(58) Field of Classification Search .............. 438/612, 438/613; 257/E21.508
See application file for complete search history.

(56) References Cited

U.S. PATENT DOCUMENTS

2006/0068579 A1* 3/2006 Suh et al. .................. 438/612

* cited by examiner

*Primary Examiner*—Trung Dang

(57) ABSTRACT

Methods of forming a microelectronic structure are described. Those methods include applying a solder paste to a portion of a board, wherein the solder paste is not applied to a ball grid array region, and placing a BGA package comprising at least one low temperature solder ball on the ball grid array region, wherein the at least one low temperature solder ball comprises a eutectic tin bismuth based solder doped with at least one of copper and nickel.

20 Claims, 4 Drawing Sheets

LOW TEMPERATURE SOLDER METALLURGY AND PROCESS FOR PACKAGING APPLICATIONS AND STRUCTURES FORMED THEREBY

BACKGROUND OF THE INVENTION

As microelectronic packaging technology advances for higher device performance, thin core, thin die technology solutions may be employed. Cost reduction, solder joint reliability and Z height requirements are important concerns. Package warpage, which in some cases may be related to interconnect joint (i.e., the interface between an interconnect structure and another surface, such as a substrate or contact pad) failures have been observed in many types of packaging assemblies, such as in ball grid array (BGA) assemblies.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
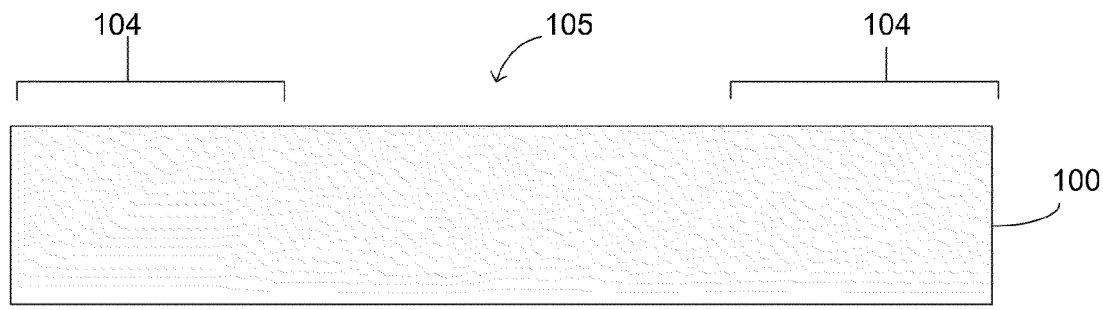
FIGS. 1a-1g represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure, such as a joint/package structure, are described. Those methods may comprise applying a solder paste to a portion of a board, wherein the solder paste is not applied to a ball grid array region, and placing a BGA package comprising at least one low temperature solder ball on the ball grid array region, wherein the at least one low temperature solder ball comprises a eutectic tin bismuth based solder doped with at least one of copper and nickel. Methods of the present invention may significantly reduce assembly yield loss due to a reduction of package warpage, as well as provide a simplified manufacturing process.

FIGS. 1a-g illustrate embodiments of methods of forming microelectronic structures, such as package and joint structures, for example. FIG. 1a illustrates a portion of a substrate 100. In one embodiment, the substrate 100 may comprise at least one of a motherboard, a printed circuit board (PCB), an interposer, a test coupon, and a land grid array socket.

In one embodiment, the substrate 100 may comprise at least one solder region 104, wherein the at least one solder region 104 may comprise a region wherein a solder paste may be placed during a subsequent process step, to be described further herein. The substrate 100 may further comprise a BGA region 105 wherein at least one package, such as a BGA package, may be placed. The locations of the at least one solder region 104 and the BGA region 105 on the substrate 100 may vary depending upon the particular application.

Figure 1B:
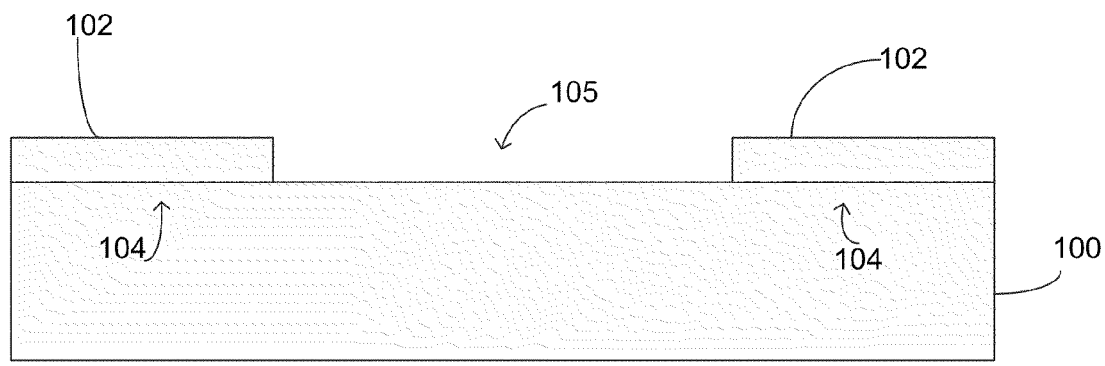
Figure 1C:
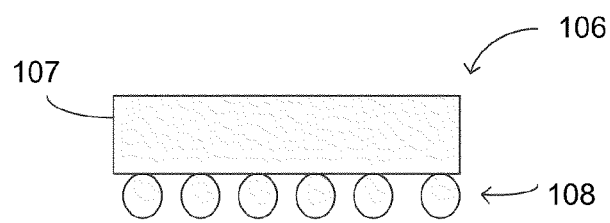
Figure 1D:
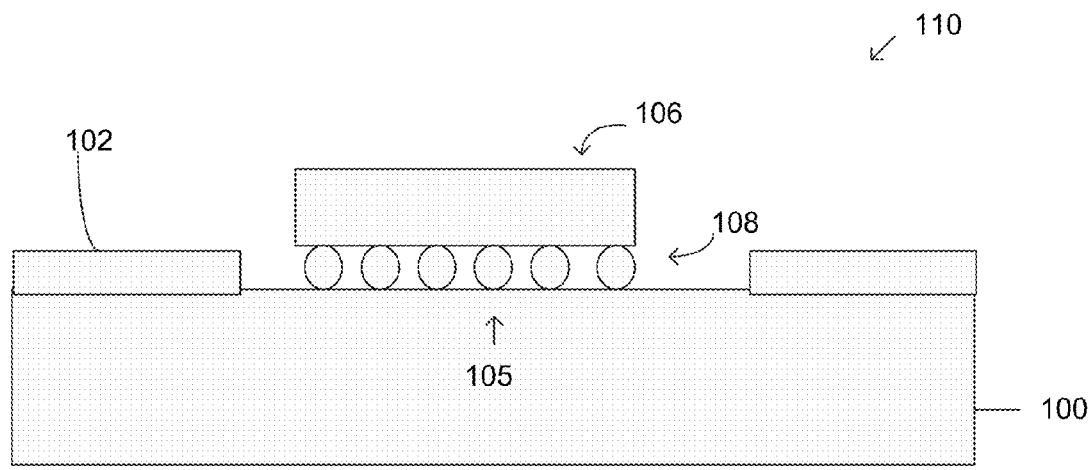

A solder paste 102 may be applied to portions of the at least one solder region 104 of the substrate 100 (FIG. 1b). In one embodiment, the solder paste 102 may comprise at least one of a SAC305 and SAC405 solder, but may comprise other suitable solder materials. In one embodiment, the solder paste 102 may comprise a reflow temperature of about 270 degrees Celsius or below. The solder paste 102 may be formed on the substrate 100 by using a stencil paste process, for example, and may be used to mount/solder various components to the substrate, but the solder paste 102 may not be used for mounting/soldering a low temperature solder package, such as a low temperature solder ball containing BGA package for example, in the at least one solder region 104.

A BGA package structure 106 may comprise at least one low temperature solder ball 108 (FIG. 1c), that may be attached to a BGA substrate 107. In one embodiment, the low temperature solder ball 108 may comprise a melting temperature of between about 120 degrees Celsius to about 160 degrees Celsius. In one embodiment, the low temperature solder ball 108 may comprise a eutectic tin bismuth based solder ball 108. In one embodiment, the at least one low temperature solder ball 108 may be doped with copper such that in an embodiment, the at least one eutectic tin bismuth solder ball 108 may comprise about 0.5 weight percent to about 1.5 weight percent copper.

In another embodiment, the at least one low temperature solder ball 108 may comprise a eutectic tin bismuth based solder with nickel doping. In one embodiment, the nickel doping may comprise about 300 ppm to about 1000 ppm. In another embodiment, the at least one low temperature solder ball 108 may be doped with both nickel and copper, which may serve to improve the reliability of the solder ball when it is joined with another surface, such as with a package substrate surface and/or a die pad surface, for example.

In another embodiment, the at least one low temperature solder ball 108 may be further doped with at least one silver and zinc. The zinc and/or silver doping may serve to reduce and/or make more ductile any intermetallic growth that may occur between the at least one low temperature solder ball 108 and surfaces that may be subsequently joined with the at least one low temperature solder ball 108 (for example when forming a solder joint structure). In another embodiment, additional elements, such as but not limited to silver, gold and/or rare earth elements may be used to dope the at least one low temperature solder ball 108, and may serve to provide solder joint grain refinement.

In an embodiment, the BGA package structure 106 may be placed on the BGA region 105 (FIG. 1d), such that the at least one low temperature solder ball 108 may make contact with the substrate 100. In one embodiment, the BGA package structure may be placed on the BGA region 105 by utilizing standard pick and place equipment and processing to form an assembled package structure 110. In one embodiment, the BGA package structure 106 may be flux dipped prior to being placed on the substrate 100. In one embodiment, the assembled package structure 110 may be reflowed at a peak temperature of about 240 degrees Celsius, for example, that may comprise the reflow temperature for the solder paste 102.

Figure 1E:
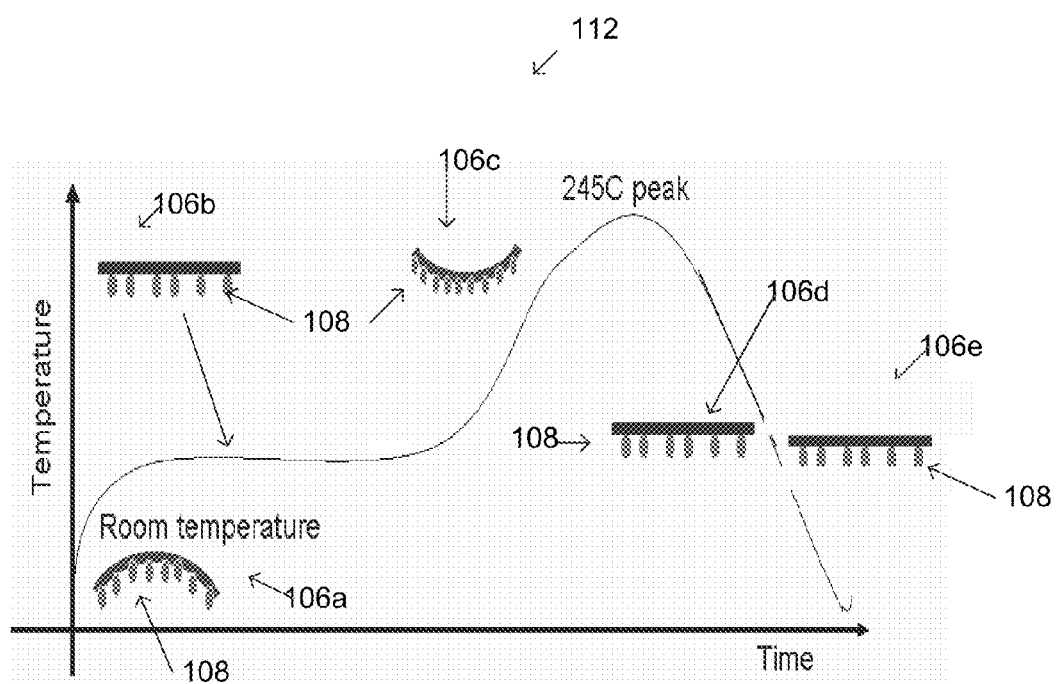

FIG. 1e depicts an embodiment of a reflow process 112, which comprises a peak temperature of about 245 degrees Celsius. At room temperature, the BGA package structure 106a may comprise a convex structure due to various stress components present within the assembled package structure 110. At a temperature of about 120 degrees Celsius to about 160 degrees Celsius, the BGA package structure 106a may comprise a substantially flat structure. The particular temperature at which the BGA package structure 106b may be flat will depend upon the melting point of the at least one temperature solder ball 108, which in turn will depend upon the concentrations of dopant species and overall composition of the low temperature solder ball 108 as described previously herein.

The BGA package structure 106c may comprise a convex structure at the peak reflow temperature, which in an embodiment may comprise a temperature of about 245 degrees Celsius (but may vary according to the particular application). The BGA package structure 106d may then comprise a flat structure at the melting temperature of the low temperature solder ball 108 (which in some cases may comprise a temperature between about 120 degrees Celsius to about 160 degrees Celsius) as the reflow temperature decreases from the peak temperature to the melting temperature. In one embodiment, the at least one low temperature solder ball 108 may be solidified at between about 120 degrees Celsius to about 160 degrees Celsius, and the BGA package structure 106d may lock in to a flat structure at that temperature, and the BGA package structure 106e may remain substantially flat at room temperature.

Utilizing a low temperature solder ball 108 with the BGA package structure 106 in conjunction with a higher temperature solder used for soldering non-BGA package components on the substrate 100, such as a PCB board for example, enables the use of a dual solder process with a single reflow temperature process. Prior art dual solder processes have exhibited package substrate warpage in many cases, which may lead to board level assembly yield loss. In order to meet packaging cost reduction targets, solder joint reliability goals and costumer Z height requirements, thin core/coreless, thin die technology solutions have been proposed.

However, both solutions may lead to worsened package warpage and potential yield loss at assembly. Larger packages may exacerbate the warpage problem. Another problem with prior art dual solder processes is that they tend to be more time consuming (requiring two reflow processes) and may also have an impact on the reliability of non-BGA package components on the boards (for example, if a low temperature solder paste is used as the surface mount solder). The embodiments of the present invention enable a very simple dual solder process to be used with a low temperature solder adoption that decreases package substrate warpage. Additionally, the use of the low temperature solder ball 108 may significantly reduce assembly open defects for highly warped packages, even with the use of high temperature solders such as SAC305/SAC405 for example.

Figure 1F:
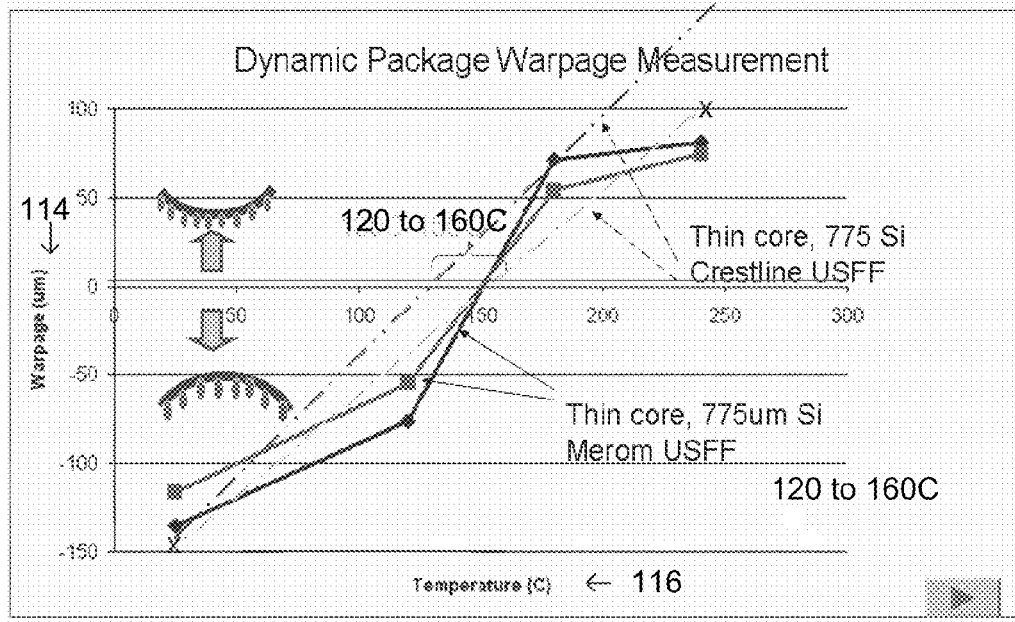

FIG. 1f depicts package warpage 114 versus temperature 116. It can be seen that packages comprising BGA solders with melting temperatures of about 120 to about 160 degrees Celsius minimize the risk of package warpage. In one embodiment, a warpage of the BGA package, such as but not limited to an ultra small form factor (USSF) package may be less than about 50 microns.

Figure 1G:
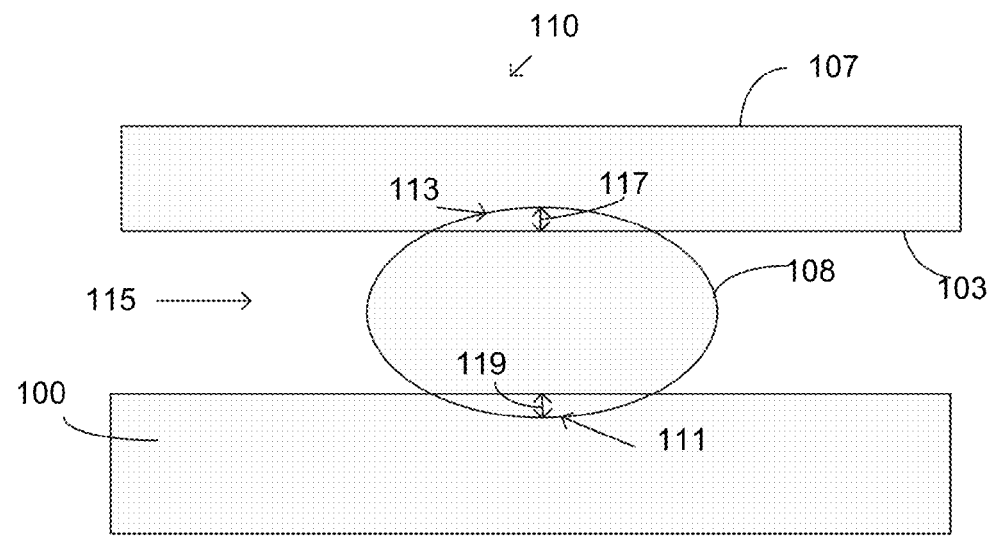

Another benefit of the embodiments of the present invention is that the copper doping of the tin bismuth low temperature solder balls 108 with the copper concentrations described previously herein (along with other doping constituents described herein), may serve to reduce the growth of an intermetallic material that may occur between the at least one solder ball 108 and any surfaces joined with/in contact with the at least one low temperature solder ball 108. In one embodiment, the growth of a Ni3Sn4 intermetallic material 111 at an interface between the substrate 100 and the at least one low temperature solder ball 108 may be diminished with the copper doping (FIG. 1g). In one embodiment, a thickness 117 of the intermetallic material 111 may comprise less than about 0.4 microns.

This decrease in the amount of intermetallic may serve to improve the shock performance and/or solder joint grain refinement of a solder joint area 115 of the assembled package structure 110. In another embodiment, the nickel doping of the low temperature solder ball 108 may serve to reduce a Cu3Sn/Cu165Sn intermetallic 113 at an interface between a die side 103 of the BGA package 107 and the at least one low temperature solder ball 108, which may serve to improve the shock performance of the assembled package structure 110. In one embodiment, a thickness 119 of the intermetallic material 113 may comprise less than about 0.4 microns.

Figure 2:
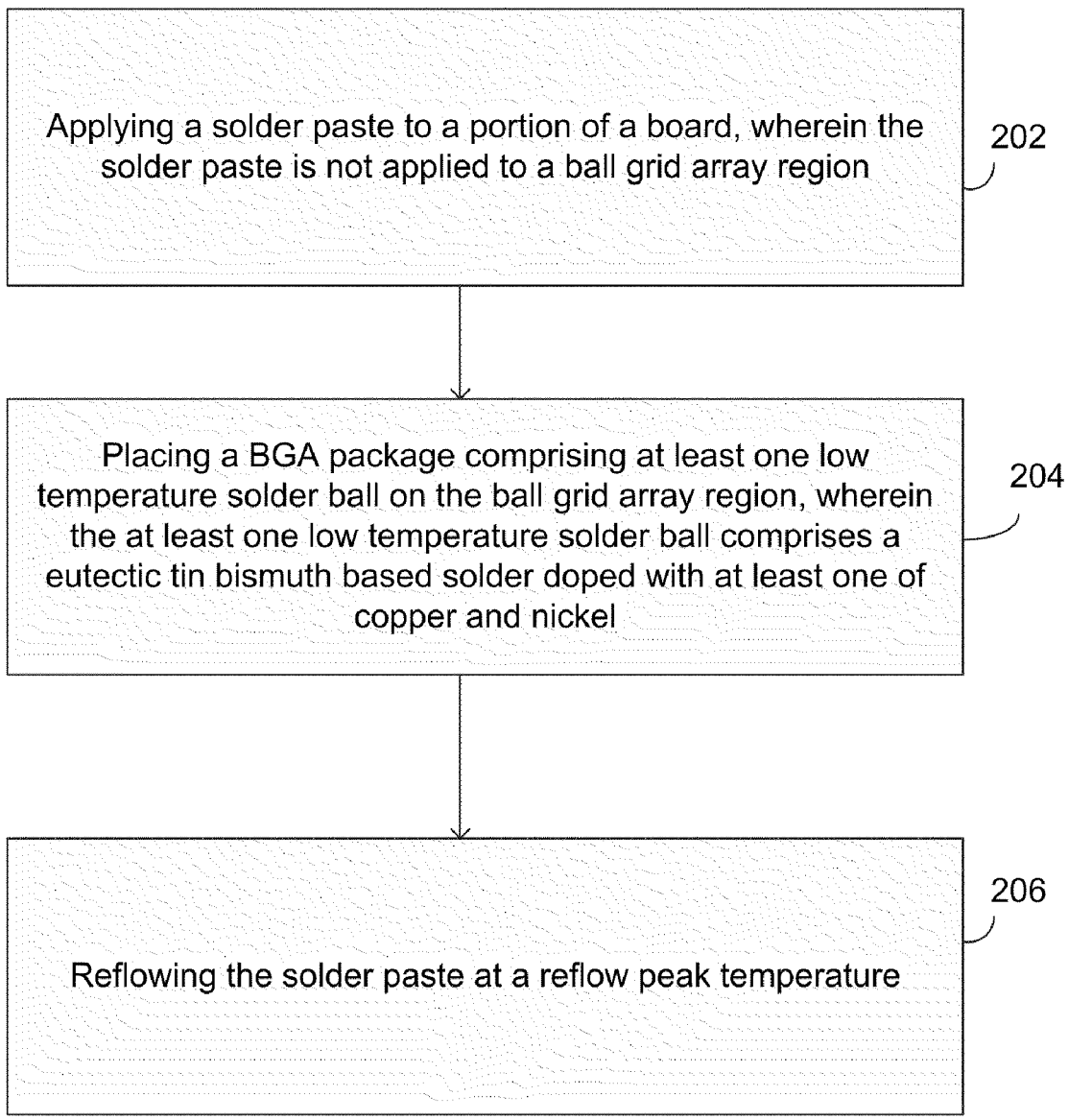
FIG. 2 represents a flow chart according to an embodiment of the present invention.

FIG. 2 depicts a flow chart of an embodiment of the present invention. At step 202, a solder paste may be applied to a portion of a board, wherein the solder paste is not applied to a solder grid array region. At step 204, a BGA package comprising at least one low temperature solder ball may be placed on the ball grid array region, wherein the at least one low temperature solder ball comprises a eutectic tin bismuth based solder doped with at least one of copper and nickel.

The melting point of the low temperature solder ball may comprise a temperature of between about 120 degrees and about 160 degrees Celsius, in some embodiments, At step 206, the solder paste may be reflowed at a reflow peak temperature. The particular temperature of the solder paste may depend upon the particular application. In one embodiment, the reflow temperature may comprise a temperature between about 230 degrees Celsius and 280 degrees Celsius.

Benefits of the present invention include cost savings since the use of a stiffener to prevent warpage of the package may be avoided. The use of a simple dual solder alloy process is enabled, thus eliminating step soldering. The use of relatively high risk, low temperature solder surface mount process and materials development is eliminated, and lower stress may be exhibited on low temperature solder BGA components than may be present in prior art package structures.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as joint and package structures, are well known in the art. Therefore, the Figures provided herein illustrate only portions of an exemplary microelectronic device that pertains to the practice of the present invention. Thus the present invention is not limited to the structures described herein.

What is claimed is:

1. A method comprising:
   applying a solder paste to a portion of a substrate, wherein the solder paste is not applied to a BGA region; and
   placing a BGA package comprising at least one low temperature solder ball on the BGA region, wherein the at least one low temperature solder ball comprises a eutectic tin bismuth based solder doped with at least one of copper and nickel.

2. The method of claim 1 further comprising wherein the copper doping comprises a percentage of between about 0.1 percent by weight to about 1.5 percent by weight of copper.

3. The method of claim 1 further comprising wherein the nickel doping comprises a percentage of between about 300 ppm to about 1000 ppm.

4. The method of claim 1 further comprising doping with at least one of silver, gold and a rare earth element.

5. The method of claim 1 further comprising wherein the solder paste comprises at least one of SAC1 and SAC2.

6. The method of claim 1 further comprising reflowing the solder paste and the low temperature solder balls at a temperature between about 230 degrees Celsius and 280 degrees Celsius.

7. The method of claim 1 wherein heating the low temperature solder comprises a melting point between about 120 and about 160 degrees Celsius.

8. The method of claim 1 further comprising applying a flux dip to the at least one low temperature solder ball prior to placing the at least one solder ball on the BGA region.

9. A method comprising:
   applying a SAC solder paste to a portion of a substrate, wherein the solder paste is not applied to a ball grid array region;
   placing a BGA package comprising at least one low temperature solder ball on the ball grid array region, wherein the at least one low temperature solder ball comprises a eutectic tin bismuth based solder doped with at least one of copper and nickel; and
   reflowing the SAC at a temperature of about 245 degrees Celsius and below.

10. The method of claim 9 further comprising wherein the copper doping comprises a percentage of between about 0.1 percent by weight to about 1.5 percent by weight, and wherein the nickel doping comprises a percentage of between about 300 ppm to about 1000 ppm.

11. The method of claim 9 further comprising wherein a warpage of the BGA package is less than about 50 microns.

12. The method of claim 1 further comprising wherein an intermetallic formation between the low temperature solder ball and the substrate is reduced, and wherein an intermetallic formation between the low temperature solder ball and a die side of a BGA substrate of the BGA package is reduced.

13. A structure comprising:
   a non-BGA package component disposed on a portion of a substrate, wherein the non-BGA package component is not disposed in a solder grid array region; and
   a BGA package comprising at least one low temperature solder ball disposed on the ball grid array region, wherein the at least one low temperature solder ball comprises a eutectic tin bismuth based solder doped with at least one of copper and nickel.

14. The structure of claim 13 wherein the copper doping comprises a percentage of between about 0.1 percent by weight to about 1.5 percent by weight, and wherein the nickel doping comprises a percentage of between about 300 ppm to about 1000 ppm.

15. The structure of claim 13 wherein the non-BGA component is soldered to the substrate with a SAC solder.

16. The structure of claim 13 wherein a warpage of the BGA package is less than about 50 microns.

17. The structure of claim 13 wherein a thickness of an intermetallic disposed between the at least one low temperature solder ball and the substrate is less than about 0.4 microns, and wherein a thickness of an intermetallic disposed between a die side of a BGA substrate of the BGA package and the at least one low temperature solder ball is less than about 0.4 microns.

18. The structure of claim 13 wherein a melting point of the at least one low temperature solder ball comprises between about 120 to about 160 degrees Celsius.

19. The structure of claim 18 wherein the at least one low temperature solder ball further comprising at least one of silver, gold and a rare earth element.

20. The structure of claim 13 wherein the BGA package comprises a USFF package.

* * * * *